(12) United States Patent
Tsai et al.

(10) Patent No.: US 10,707,114 B2
(45) Date of Patent: Jul. 7, 2020

(54) METHOD OF FORMING ISOLATION LAYER

(71) Applicant: TAIWAN SEMICONDUCTOR MANUFACTURING CO., LTD., Hsinchu (TW)

(72) Inventors: Teng-Chun Tsai, Hsinchu (TW); Bing-Hung Chen, Taipei County (TW); Chien-Hsun Wang, Hsinchu (TW); Cheng-Tung Lin, Hsinchu County (TW); Chih-Tang Peng, Hsinchu County (TW); De-Fang Chen, Hsinchu (TW); Huan-Just Lin, Hsinchu (CN); Li-Ting Wang, Hsinchu (TW); Yung-Cheng Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/049,520

(22) Filed: Jul. 30, 2018

(65) Prior Publication Data

US 2018/0350655 A1 Dec. 6, 2018

Related U.S. Application Data

(62) Division of application No. 14/303,791, filed on Jun. 13, 2014, now Pat. No. 10,418,271.

(51) Int. Cl.
*H01L 29/66* (2006.01)
*H01L 21/762* (2006.01)
(Continued)

(52) U.S. Cl.
CPC ............ *H01L 21/762* (2013.01); *B82Y 10/00* (2013.01); *H01L 21/31053* (2013.01);
(Continued)

(58) Field of Classification Search
CPC ............ H01L 29/775; H01L 29/42392; H01L 29/66439; H01L 29/0676; H01L 21/31053;
(Continued)

(56) References Cited

U.S. PATENT DOCUMENTS

| 7,425,491 B2 | 9/2008 | Forbes |
| 8,207,032 B2 * | 6/2012 | Fischer ........... H01L 21/823425 438/206 |

(Continued)

FOREIGN PATENT DOCUMENTS

| CN | 102867752 A | 1/2013 |
| DE | 602004008034 T2 | 4/2008 |

(Continued)

OTHER PUBLICATIONS

Office Action issued in corresponding German Patent Application No. 10 2014 119 640.6, dated Sep. 27, 2017.

(Continued)

*Primary Examiner* — Michael M Trinh
(74) *Attorney, Agent, or Firm* — McDermott Will & Emery LLP

(57) ABSTRACT

According to an exemplary embodiment, a method of forming an isolation layer is provided. The method includes the following operations: providing a substrate; providing a vertical structure having a first layer over the substrate; providing a first interlayer dielectric over the first layer; performing CMP on the first interlayer dielectric; and etching back the first interlayer dielectric and the first layer to form the isolation layer corresponding to a source of the vertical structure.

20 Claims, 30 Drawing Sheets

(51) Int. Cl.
- *H01L 21/3105* (2006.01)
- *H01L 29/78* (2006.01)
- *H01L 21/311* (2006.01)
- *B82Y 10/00* (2011.01)
- *H01L 21/8238* (2006.01)
- *H01L 29/423* (2006.01)
- *H01L 29/775* (2006.01)
- *H01L 29/06* (2006.01)
- *H01L 29/41* (2006.01)

(52) U.S. Cl.
CPC .. *H01L 21/31055* (2013.01); *H01L 21/31116* (2013.01); *H01L 21/76224* (2013.01); *H01L 21/823885* (2013.01); *H01L 29/0676* (2013.01); *H01L 29/413* (2013.01); *H01L 29/42372* (2013.01); *H01L 29/42392* (2013.01); *H01L 29/66439* (2013.01); *H01L 29/66666* (2013.01); *H01L 29/775* (2013.01); *H01L 29/7827* (2013.01); *H01L 21/823842* (2013.01)

(58) Field of Classification Search
CPC ....... H01L 21/31055; H01L 21/823885; H01L 21/823842; H01L 21/76224; H01L 29/66666; H01L 29/66742; H01L 29/7827; H01L 29/7828; H01L 29/78642; H01L 29/66787; H01L 21/823487; H01L 21/823878; H01L 21/823481
See application file for complete search history.

(56) References Cited

U.S. PATENT DOCUMENTS

| | | | | |
|---|---|---|---|---|
| 8,435,900 | B2* | 5/2013 | Shao | H01L 21/31053 216/100 |
| 8,754,470 | B1 | 6/2014 | Chuang et al. | |
| 2004/0152270 | A1 | 8/2004 | Weis | |
| 2005/0093082 | A1 | 5/2005 | Son et al. | |
| 2006/0022262 | A1 | 2/2006 | Yoon et al. | |
| 2008/0280442 | A1* | 11/2008 | Kwak | H01L 21/31053 438/693 |
| 2011/0303973 | A1* | 12/2011 | Masuoka | H01L 21/26586 257/329 |
| 2011/0316080 | A1 | 12/2011 | Luo et al. | |
| 2012/0190201 | A1* | 7/2012 | Park | C09G 1/02 438/693 |
| 2012/0217587 | A1* | 8/2012 | Wang | H01L 21/31055 257/401 |
| 2012/0319201 | A1* | 12/2012 | Sun | H01L 21/823487 257/338 |
| 2013/0095623 | A1 | 4/2013 | Guo et al. | |
| 2013/0095644 | A1* | 4/2013 | Tu | H01L 21/31053 438/585 |
| 2014/0042524 | A1* | 2/2014 | Chuang | H01L 21/28114 257/329 |
| 2014/0061775 | A1 | 3/2014 | Chuang et al. | |
| 2014/0106554 | A1* | 4/2014 | Pozzi | H01L 21/28088 438/589 |
| 2015/0228718 | A1 | 8/2015 | Lin et al. | |
| 2015/0228759 | A1 | 8/2015 | Chen et al. | |
| 2015/0249127 | A1* | 9/2015 | Xie | H01L 29/0692 438/437 |
| 2015/0270159 | A1* | 9/2015 | Huang | H01L 21/76229 438/427 |
| 2015/0318214 | A1* | 11/2015 | Tsai | H01L 21/823487 257/9 |

FOREIGN PATENT DOCUMENTS

| | | |
|---|---|---|
| JP | 2006-080264 A | 3/2006 |
| KR | 10-0373355 B1 | 2/2003 |
| KR | 10-0515061 B1 | 9/2005 |
| KR | 10-2010-0019909 A | 2/2010 |
| TW | 201303980 A | 1/2013 |

OTHER PUBLICATIONS

Final Office Action issued in U.S. Appl. No. 14/303,791 dated Feb. 8, 2018.
Office Action issued in U.S. Appl. No. 14/303,791 dated Jul. 27, 2018.
Office Action issued in U.S. Appl. No. 14/303,791 dated Jun. 14, 2017.
Final Office Action issued in U.S. Appl. No. 14/303,791 dated Mar. 8, 2017.
Office Action issued in U.S. Appl. No. 14/303,791 dated Sep. 8, 2016.
Korean Office Action issued in Application No. 10-2014-0175933 dated Deptember 3, 2015.
Taiwanese Office Action issed in Taiwanese Application No. 104106170 dated Apr. 8, 2016.
Office Action issued in corresponding Chinese Application No. 201410445247.4 dated Sep. 12, 2017.
Taiwanese Office Action issed in Taiwanese Application No. 104106170 dated Sep. 30, 2016.
Office Action issued in related U.S. Appl. No. 14/303,791, dated Jul. 27, 2018.

* cited by examiner

METHOD OF FORMING ISOLATION LAYER

RELATED APPLICATIONS

This application is a Division of application Ser. No. 14/303,791, filed on Jun. 13, 2014, the disclosures of which application is incorporated herein by reference.

BACKGROUND

Vertical semiconductor devices, such as vertical gate-all-around transistors, are an emerging research area in the semiconductor industry. However, low pattern density of the vertical semiconductor devices may weaken thickness uniformity control of inter-layer dielectrics (or isolation layer) therein. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
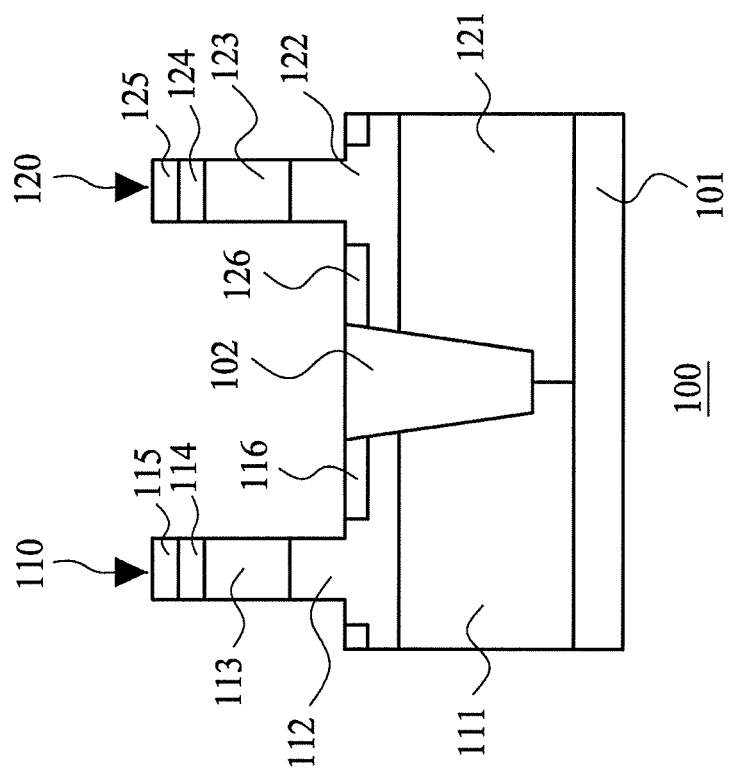
FIGS. 1-11 are sectional views illustrating an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method of forming an isolation layer. This disclosure provides at least four types of manufacturing schemes for the isolation layer.

The first includes: deposition of an interlayer dielectric over a vertical structure with a first layer; performing a chemical mechanical polishing (CMP) on the first interlayer dielectric, stopping the CMP on the first layer; and etching back the first interlayer dielectric and the first layer. The second includes: deposition of an interlayer dielectric over a vertical structure with a first layer; performing CMP on the first interlayer dielectric, stopping the CMP on a predetermined height of the first interlayer dielectric; and etching back the first interlayer dielectric and the first layer.

The third includes: deposition of an interlayer dielectric over a vertical structure with a first layer; providing a second layer over the first interlayer dielectric; providing a second interlayer dielectric over the second layer; performing CMP on the first interlayer dielectric, the second layer, and the second interlayer dielectric; stopping the CMP on a lower portion of the second layer; and etching back the first interlayer dielectric and the first layer. The third method may utilize a three layer sandwich structure of ONO (oxide/nitride/oxide layers) to form the first interlayer dielectric, the second layer, and the second interlayer dielectric. The first interlayer dielectric may be formed of, for example, flowable oxide; the second layer may be formed of, for example, SiN, SiON, SiC, SiCN, SiCO, or SiCON; and the second interlayer dielectric may be formed of, for example, plasma enhanced oxide (PE oxide). The second layer may have a thickness of about 5-300 angstroms. The second interlayer dielectric may have a thickness of about 100-3000 angstroms.

The fourth includes: deposition of an interlayer dielectric over a vertical structure with a first layer; performing CMP on the first interlayer dielectric and stopping the CMP on a predetermined height of the first interlayer dielectric; etching back the first interlayer dielectric and the first layer by using gas cluster ion beams; performing wet clean process on the first interlayer dielectric; and etching back the first interlayer dielectric and the first layer by using plasma etching or wet etching. Gas, such as $NF_3$, $SiF_4$, $CHF_3$ and $CF_4$, may be used in gas cluster ion beams. A post wet clean is an option to reduce defects produced after the process of using gas cluster ion beams.

The abovementioned four methods can be applied to formation of: (1) a bottom isolation layer corresponding to a source of the vertical structure; (2) a middle isolation layer corresponding to a channel of the vertical structure; and (3) a top isolation layer corresponding to a drain of the vertical structure. The methods provide good thickness uniformity of the isolation layers to enhance device performance.

FIG. 1 is a sectional view illustrating an exemplary semiconductor device in accordance with some embodiments. As shown in FIG. 1, a semiconductor device 100 is provided. In the semiconductor device 100, a first vertical structure 110 and a second vertical structure 120 are provided over a substrate 101. The first vertical structure 110 and the second vertical structure 120 may be vertical-gate-all-around devices electrically isolated by shallow trench isolation 102. The first vertical structure 110 may be a PMOS, and may include an n-well 111, a first source 112, a first channel 113, and a first drain 114. The second vertical structure 120 may be an NMOS, and may include a p-well 121, a second source 122, a second channel 123, and a second drain 124. Silicides 115, 116, 125, 126 are used to reduce contact resistance.

The first source 112 is disposed over the n-well 111. The first channel 113 is disposed over the first source 112. The first drain 114 is disposed over the first channel 113. The second source 122 is disposed over the p-well 121. The second channel 123 is disposed over the second source 122. The second drain 124 is disposed over the second channel 123. The following procedures may be performed on the first vertical structure 110 and the second vertical structure 120, so will only be discussed below with respect to the first vertical structure 110.

In one embodiment, the substrate 101 includes a crystalline silicon substrate. In some alternative embodiments, the substrate 101 may be made of some other suitable elemental semiconductor, such as diamond or gelluanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 101 may include an epitaxial layer (epi-layer), may be strained for performance enhancement, and/or may include a silicon-on-insulator (SOI) structure.

Figure 2:
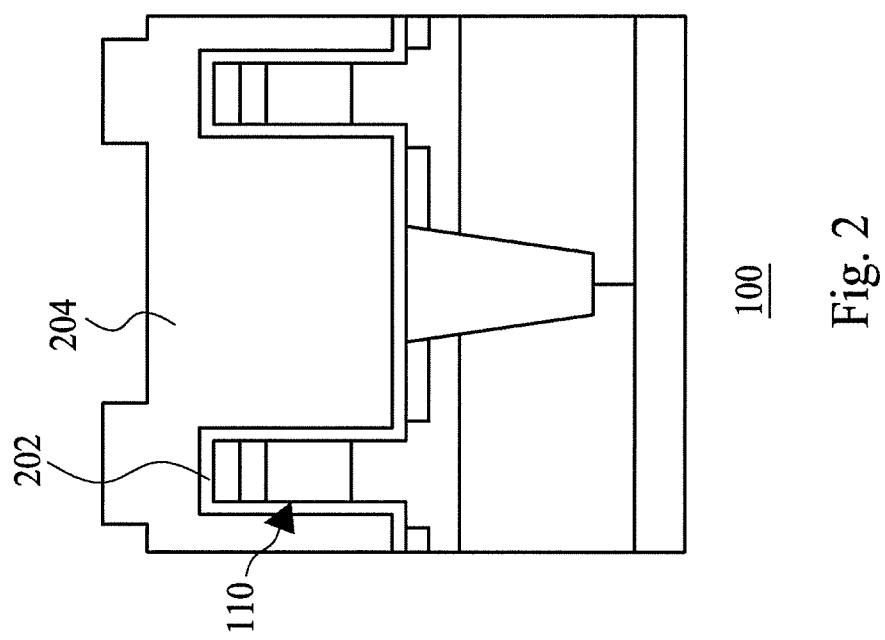

FIG. 2 is a sectional view illustrating the exemplary semiconductor device in accordance with some embodiments. As shown in FIG. 2, a first layer 202 is formed over the first vertical structure 110. The first layer 202 may be formed of SiN as an etch stop layer. The first layer 202 may have a thickness of, for example, about 30-300 angstroms. In the embodiment, the first layer 202 is included in the first vertical structure 110. Moreover, a first interlayer dielectric 204 (e.g., an oxide layer) is formed over the first layer 202.

Figure 3:
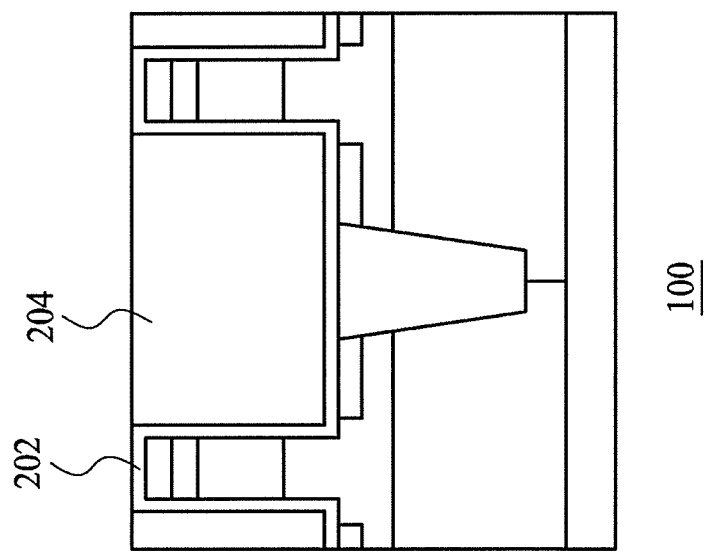

FIG. 3 is a sectional view illustrating the exemplary semiconductor device in accordance with some embodiments. As shown in FIG. 3, a chemical mechanical polishing is performed on the first interlayer dielectric 204 and stops on the first layer 202. Stopping the CMP on the first layer 202 provides good wafer uniformity.

Figure 4:
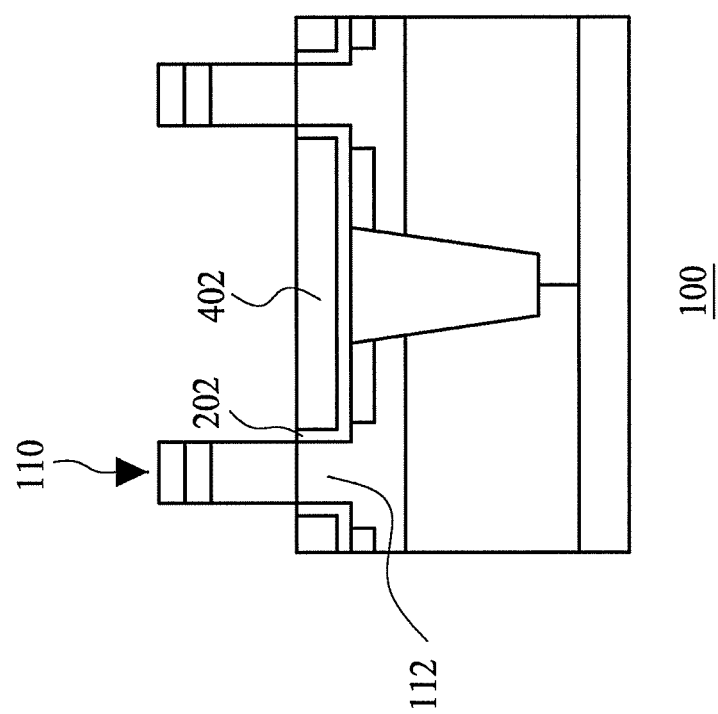

FIG. 4 is a sectional view illustrating the exemplary semiconductor device in accordance with some embodiments. As shown in FIG. 4, the first interlayer dielectric 204 and the first layer 202 are etched back to form the isolation layer 402 corresponding to the source 112 of the first vertical structure 110 by using wet etching or plasma etching. In the embodiment, the isolation layer 402 is aligned to a top surface of the source 112 in conjunction with the channel 113. The method provides good thickness uniformity of the isolation layer 402 among different wafers.

Figure 5:
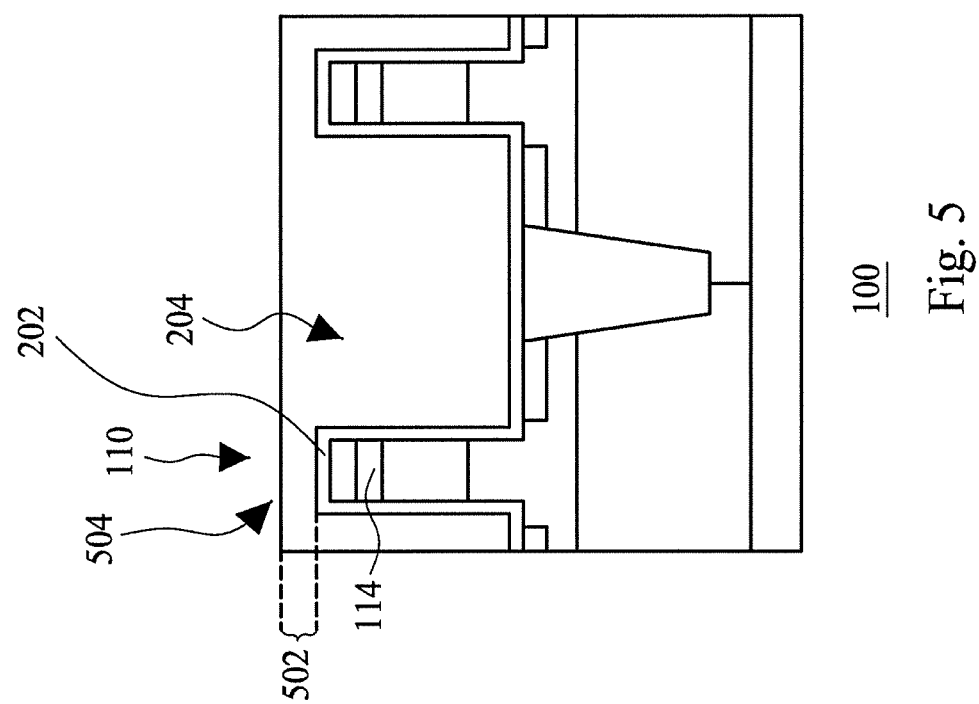

FIG. 5 is a sectional view illustrating the exemplary semiconductor device in accordance with some embodiments. Continuing from FIG. 2, as shown in FIG. 5, a chemical mechanical polishing is performed on the first interlayer dielectric 204 and stops on a predetermined thickness 502 (e.g., about 100-1000 angstroms) of the first interlayer dielectric 204 above the first vertical structure 110. In details, the predetermined thickness 502 may be a thickness measured from the first layer 202 above the drain 114 of the first vertical structure 110. Stopping the CMP on the predetermined thickness 502 of the first interlayer dielectric 204 provides good die uniformity.

The chemical polishing process may be configured as follows: polishing down force may be about 0.5-5 psi; table speed may be about 30-110 rpm; slurry type may include colloidal $SiO_2$, $Al_2O_3$ or $CeO_2$ based slurries; and slurry flow rate may be about 50-500 ml/min.

Figure 6:
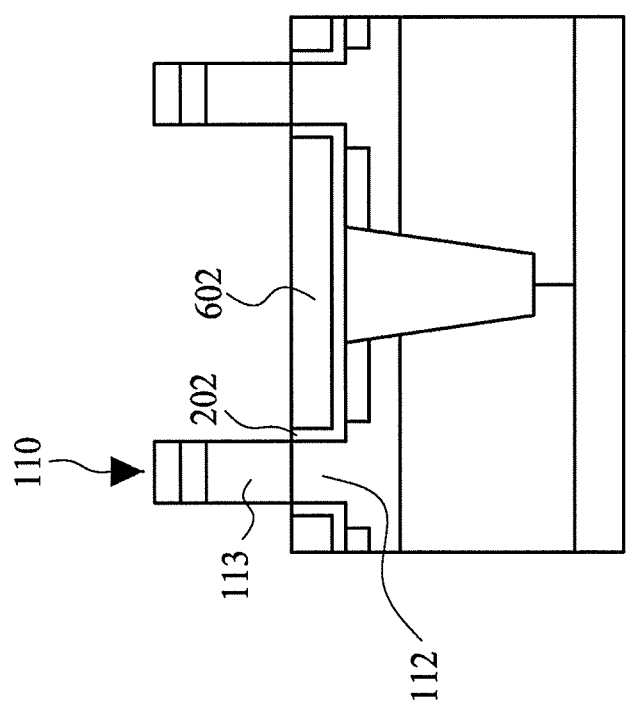

FIG. 6 is a sectional view illustrating the exemplary semiconductor device in accordance with some embodiments. Continuing from FIG. 5, as shown in FIG. 6, the first interlayer dielectric 204 and the first layer 202 are etched back to form the isolation layer 602 corresponding to the source 112 of the first vertical structure 110 by using wet etching or plasma etching. In the embodiment, the isolation layer 602 is aligned to a top surface of the source 112 in conjunction with the channel 113. The method provides good thickness uniformity of the isolation layer 602 among different dies.

In some embodiments, before the etch back of the first interlayer dielectric 204 and the first layer 202 by using wet etching or plasma etching, another etch back may be applied to the first interlayer dielectric 204 and the first layer 202 by using gas cluster ion beams.

The gas cluster ion beams may be configured as follows: processing gas may include $NF_3$, $SiF_4$, $CHF_3$, or $CF_4$; carrier gas may include $N_2$ or He; the cluster accelerate voltages may be 1 KV-200 KV; the cluster dose may be about $10^{13}$-$10^{17}$ $cm^2$/sec; the cluster flow may be 100-5000 sccm; the pressure may be about $10^{-3}$-$10^{-8}$ torr; the cluster number may be about 100~50000 molecules; and the cluster size may be about 1-500 nanometers. Gas cluster ion beams may generate an active energy (e.g., 1-3 eV/molecule) for the surfaces of the first interlayer dielectric 204 and the first layer 202, resulting in high temperature (e.g., $10^4$K) at the surfaces. Gas cluster ion beams heats the processing gas to produce fluorine which reacts with the surfaces to form $SiF_4$ and $O_2$, O, NO, $NO_2$, $H_2O$, CO, or $CO_2$ volatile gases.

In some embodiments, a post wet clean is an option to reduce defects produced after the process of using gas cluster ion beams. The wet clean process may use combination of $O_3$, dilute HF and Ammonia($NH_3$) as cleaner for one to five times.

Figure 7:
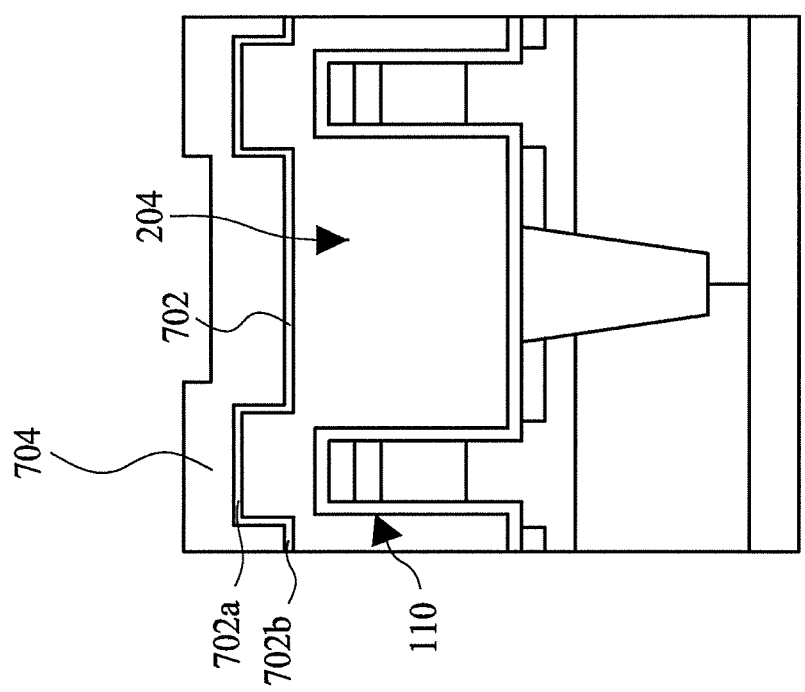

FIG. 7 is a sectional view illustrating the exemplary semiconductor device in accordance with some embodiments. Continuing from FIG. 2, as shown in FIG. 7, a second layer 702 is formed over the first interlayer dielectric 204. A second interlayer dielectric 704 is formed over the second layer 702.

The three layer sandwich structure of ONO (oxide/nitride/oxide layers) may be utilized to form the first interlayer dielectric 204, the second layer 702, and the second interlayer dielectric 704. The first interlayer dielectric 204 may be formed of, for example, flowable oxide; the second layer 702 may be formed of, for example, SiN, SiON, SiC, SiCN, SiCO, or SiCON; and the second interlayer dielectric 704 may be formed of, for example, plasma enhanced oxide (PE oxide). The second layer 702 may have a thickness of 5-300 angstroms. The second interlayer dielectric 704 may have a thickness of 100-3000 angstroms.

Moreover, a portion 702a of the second layer 702 refers to an upper portion which corresponds to protrusion of the first vertical structures 110; the portion 702b of the second layer 702 refers to a lower portion which corresponds to underlying areas except for the vertical protrusion. Generally, the areas having the protrusion are less than 10% of the entire die so that the portion 702a of the second layer 702 is more vulnerable to chemical polishing process than is the portion 702b of the second layer 702.

Figure 8:
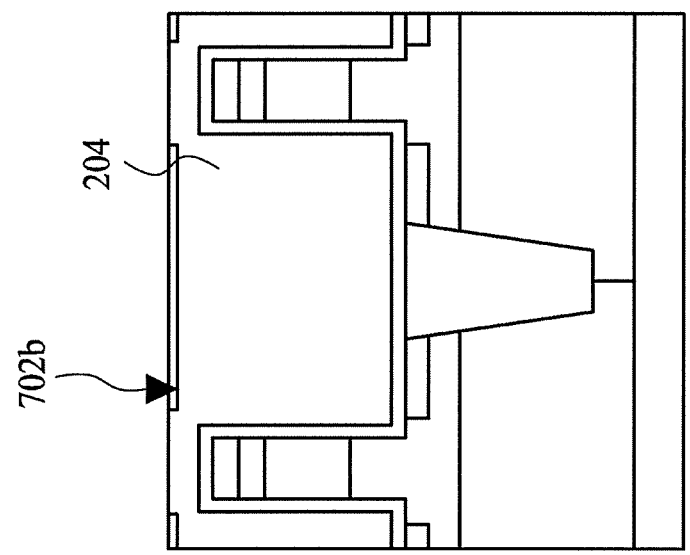

FIG. 8 is a sectional view illustrating the exemplary semiconductor device in accordance with some embodiments. As shown in FIGS. 7 and 8, a chemical polishing process is performed on the first interlayer dielectric 204, the second layer 702, and the second interlayer dielectric 704, and stops on the lower portion 702b of the second layer 702.

Figure 9:
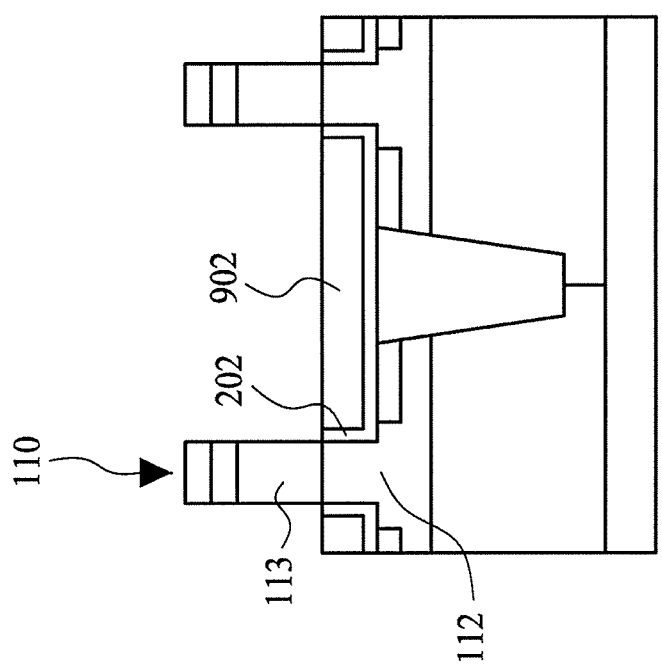

FIG. 9 is a sectional view illustrating the exemplary semiconductor device in accordance with some embodiments. Continuing from FIG. 8, as shown in FIG. 9, the first interlayer dielectric 204 and the first layer 202 are etched back to form the isolation layer 902 corresponding to the source 112 of the first vertical structure 110 by using wet etching or plasma etching. In the embodiment, the isolation layer 902 is aligned to a top surface of the source 112 in conjunction with the channel 113. The method provides good thickness uniformity of the isolation layer 902.

Figure 10:
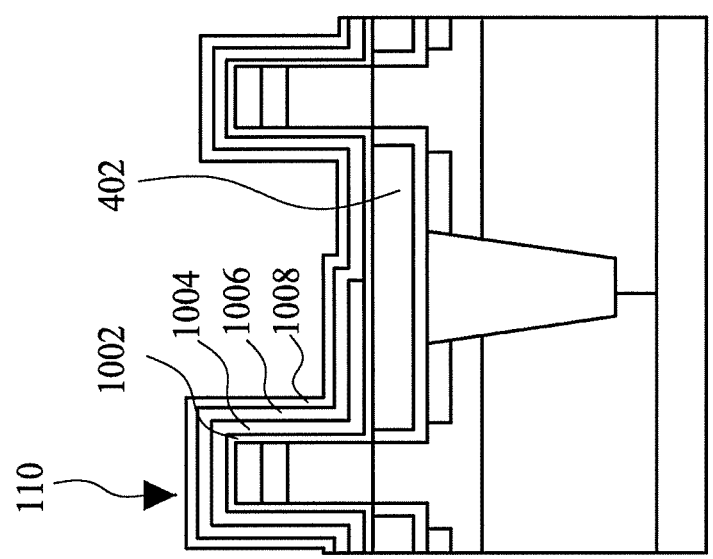

FIG. 10 is a sectional view illustrating the exemplary semiconductor device in accordance with some embodiments. Continuing from FIG. 4, as shown in FIG. 10, a high-k dielectric layer 1002, work function metal (WFM) layers 1004, 1006, and a metal gate 1008 are formed over the first vertical structure 110. The processes shown in FIG. 10 may be applied to and continues from FIG. 6 or FIG. 9.

Figure 11:
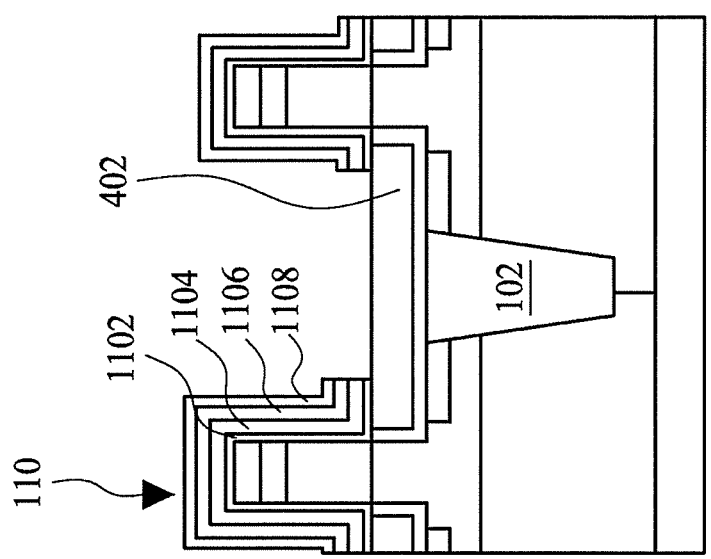

FIG. 11 is a sectional view illustrating the exemplary semiconductor device in accordance with some embodiments. Continuing from FIG. 10, as shown in FIG. 11, a portion of the high-k dielectric layer 1002, the work function metal (WFM) layers 1004, 1006, and the metal gate 1008 above the STI 102 between the first vertical structure 110 and second vertical structure 120 are etched back, and the etch-back stops on the isolation layer 402 as a bottom interlayer dielectric.

Figure 12:
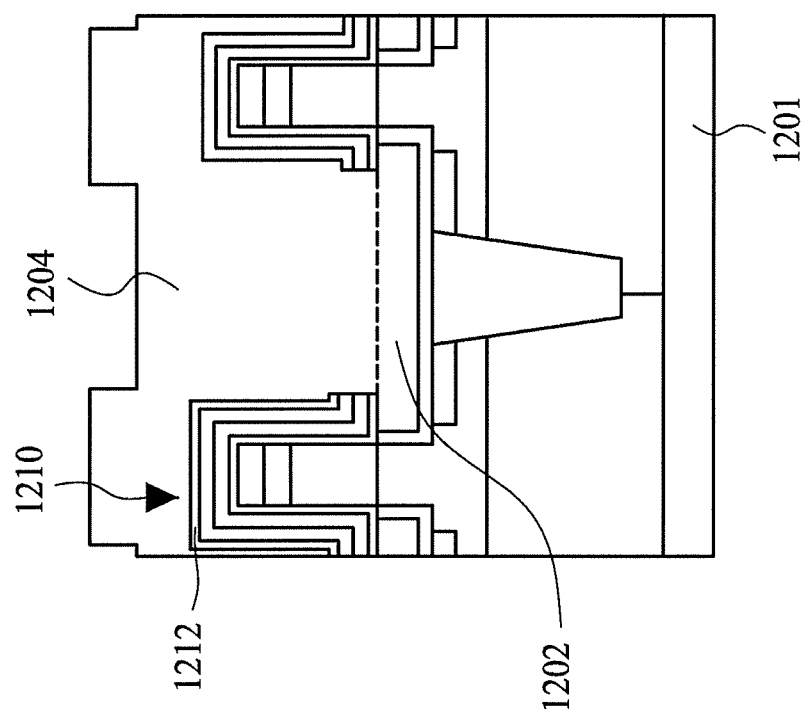
FIGS. 12-20 are sectional views illustrating another exemplary semiconductor device in accordance with some embodiments.

FIG. 12 is a sectional view illustrating an exemplary semiconductor device in accordance with some embodiments. As shown in FIG. 12, a substrate 1201 having a bottom interlayer dielectric 1202 is provided. A vertical structure 1210 (similar to the first vertical structure 110 in FIG. 11) having a first layer 1212 is provided over the substrate 1201. The first layer 1212 may be, for example, a metal gate. Moreover, a first interlayer dielectric 1204 (e.g., an oxide layer) is formed over the first layer 1212 and the bottom interlayer dielectric 1202.

Figure 13:
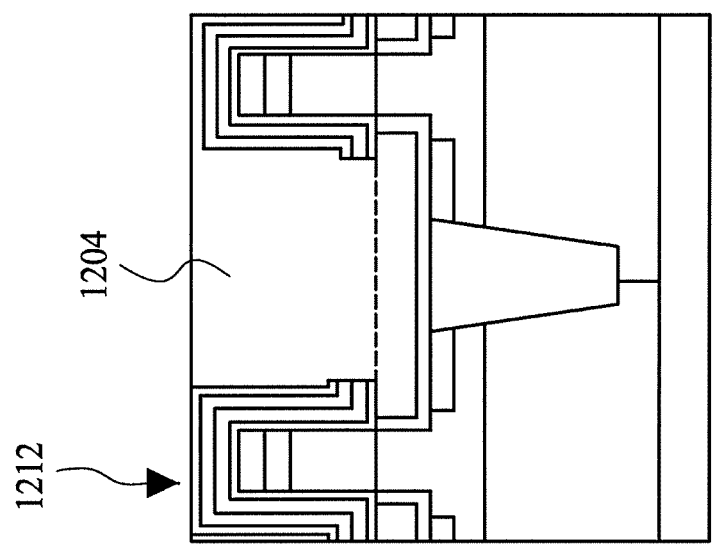

FIG. 13 is a sectional view illustrating the exemplary semiconductor device in accordance with some embodiments. As shown in FIG. 13, chemical mechanical polishing is performed on the first interlayer dielectric 1204 and stops on the first layer 1212. Stopping the CMP on the first layer 1212 provides good wafer uniformity.

Figure 14:
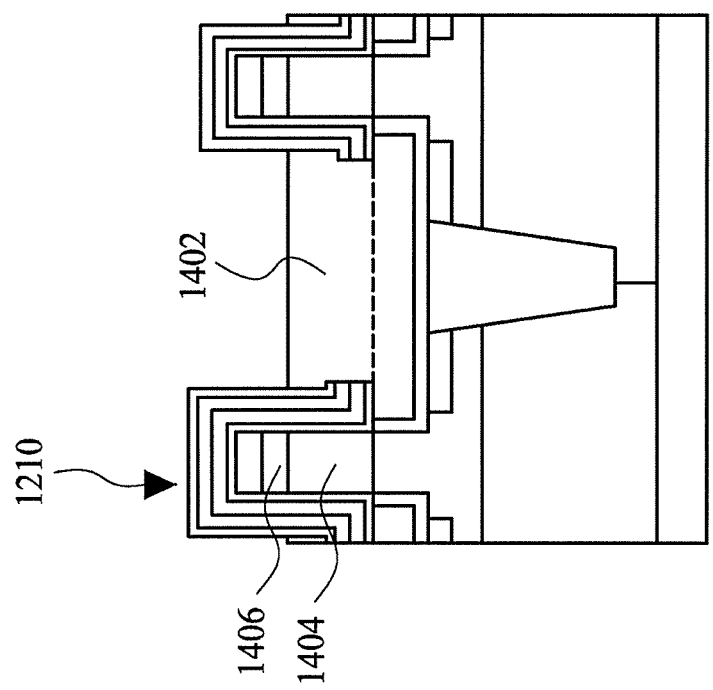

FIG. 14 is a sectional view illustrating the exemplary semiconductor device in accordance with some embodiments. As shown in FIG. 14, the first interlayer dielectric 1204 is etched back to form the isolation layer 1402 corresponding to a channel 1404 of the first vertical structure 1210 by using wet etching or plasma etching. In the embodiment, the isolation layer 1402 is aligned to a top surface of the channel 1404 in conjunction with a drain 1406. The method provides good thickness uniformity of the isolation layer 1402 among different wafers.

Figure 15:
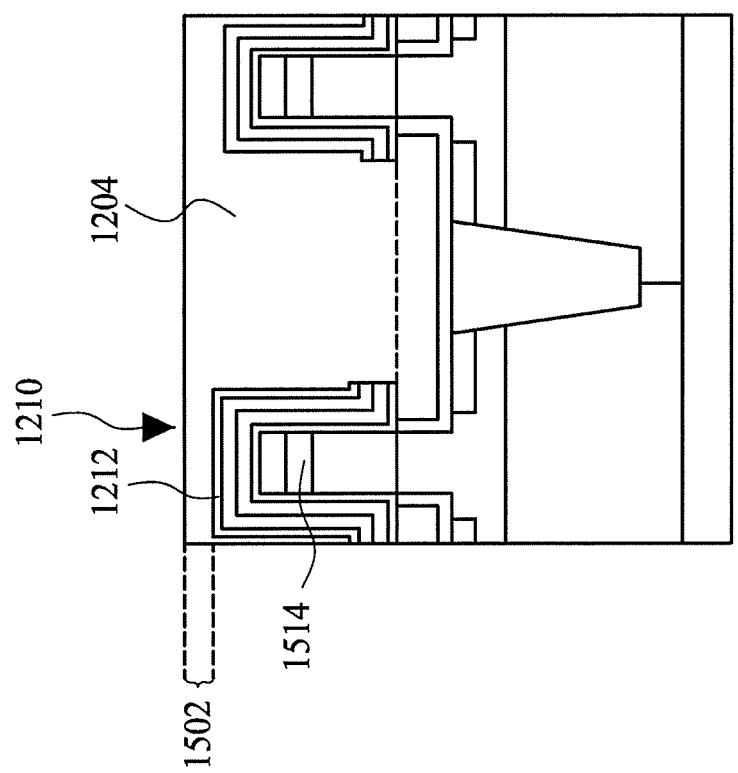

FIG. 15 is a sectional view illustrating the exemplary semiconductor device in accordance with some embodiments. Continuing from FIG. 12, as shown in FIG. 15, a chemical mechanical polishing is performed on the first interlayer dielectric 1204 and stops on a predetermined thickness 1502 (e.g., about 100-1000 angstroms) of the first interlayer dielectric 1204 above the first vertical structure 1210. In details, the predetermined thickness 1502 may be a thickness measured from the first layer 1212 above a drain 1514 of the first vertical structure 1210. Stopping the CMP on the predetermined thickness 1502 of the first interlayer dielectric 1204 provides good die uniformity.

The chemical polishing process may be configured as follows: polishing down force may be about 0.5-5 psi; table speed may be about 30-110 rpm; slurry type may include colloidal $SiO_2$, $Al_2O_3$ or $CeO_2$ based slurries; and slurry flow rate may be about 50-500 ml/min.

Figure 16:
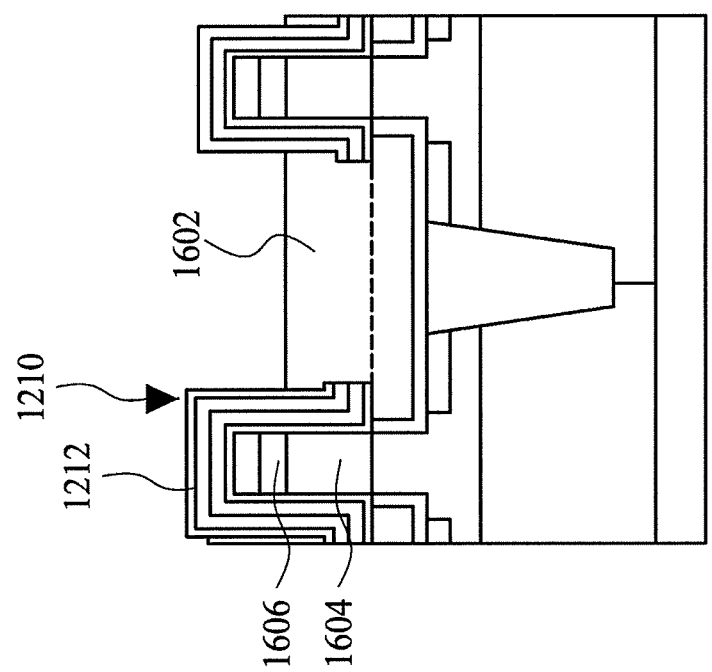

FIG. 16 is a sectional view illustrating the exemplary semiconductor device in accordance with some embodiments. Continuing from FIG. 15, as shown in FIG. 16, the first interlayer dielectric 1204 is etched back to form the isolation layer 1602 corresponding to a channel 1604 of the first vertical structure 1210 by using wet etching or plasma etching. In the embodiment, the isolation layer 1402 is aligned to a top surface of a channel 1604 in conjunction with a drain 1606. The method provides good thickness uniformity of the isolation layer 1602 among different dies.

In some embodiments, before the etch back of the first interlayer dielectric 1204 by using wet etching or plasma etching, another etch back may be applied to the first interlayer dielectric 1204 by using gas cluster ion beams.

The gas cluster ion beams may be configured as follows: processing gas may include $NF_3$, $SiF_4$, $CHF_3$, or $CF_4$; carrier gas may include $N_2$ or He; the cluster accelerate voltages may be 1 KV-200 KV; the cluster dose may be about $10^{13}$-$10^{17}$ $cm^2$/sec; the cluster flow may be 100-5000 sccm; the pressure may be about $10^{-3}$-$10^{-8}$ torr; the cluster number may be about 100~50000 molecules; and the cluster size may be about 1-500 nanometers. Gas cluster ion beams may generate an active energy (e.g., 1-3 eV/molecule) for the surfaces of the first interlayer dielectric 1204, resulting in high temperature (e.g., $10^4$ K) at the surfaces. Gas cluster ion beams heats the processing gas to produce fluorine which reacts with the surfaces to form $SiF_4$ and $O_2$, O, NO, $NO_2$, $H_2O$, CO, or $CO_2$ volatile gases.

In some embodiments, a post wet clean is an option to reduce defects produced after the process of using gas cluster ion beams. The wet clean process may use combination of $O_3$ and dilute HF and Ammonia($NH_3$) as cleaner for one to five times.

Figure 17:
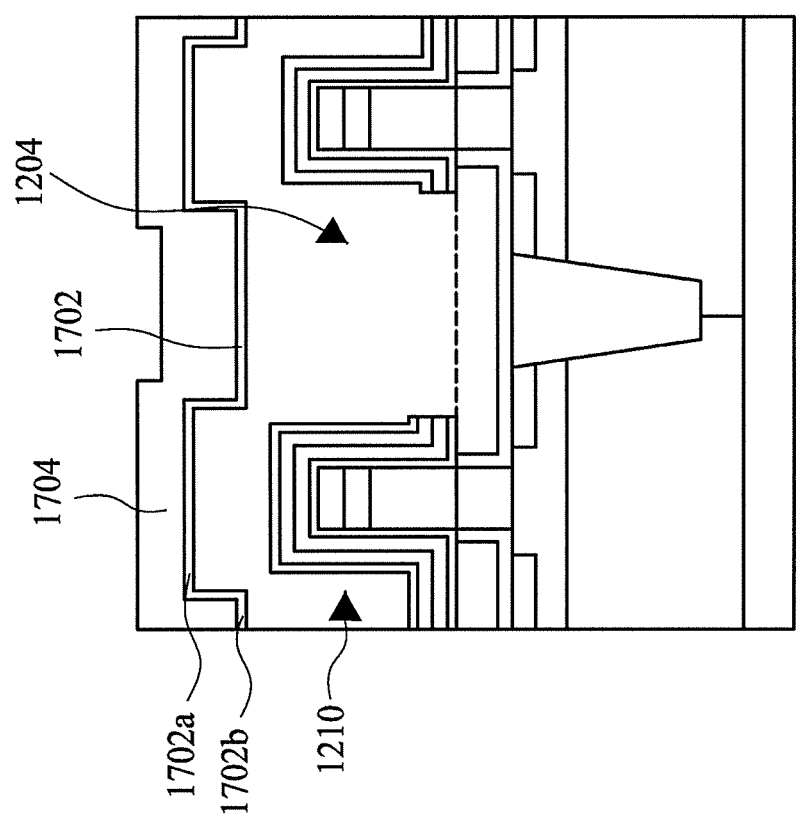

FIG. 17 is a sectional view illustrating the exemplary semiconductor device in accordance with some embodiments. Continuing from FIG. 12, as shown in FIG. 17, a second layer 1702 is formed over the first interlayer dielectric 1204. A second interlayer dielectric 1704 is formed over the second layer 1702.

The three layer sandwich structure of ONO (oxide/nitride/oxide layers) may be utilized to form the first interlayer dielectric 1204, the second layer 1702, and the second interlayer dielectric 1704. The first interlayer dielectric 1204 may be formed of, for example, flowable oxide; the second layer 1702 may be formed of, for example, SiN, SiON, SiC, SiCN, SiCO, or SiCON; and the second interlayer dielectric 1704 may be formed of, for example, plasma enhanced oxide (PE oxide). The second layer 1702 may have a thickness of 5-300 angstroms. The second interlayer dielectric 1704 may have a thickness of 100-3000 angstroms.

Moreover, a portion 1702a of the second layer 1702 refers to an upper portion which corresponds to protrusion of the first vertical structures 1210; the portion 1702b of the second layer 1702 refers to a lower portion which corresponds to underlying areas except for the vertical protrusion. Generally, the areas having the protrusion are less than 10% of the entire die so that the portion 1702a of the second layer 1702 is more vulnerable to chemical polishing process than is the portion 1702b of the second layer 1702.

Figure 18:
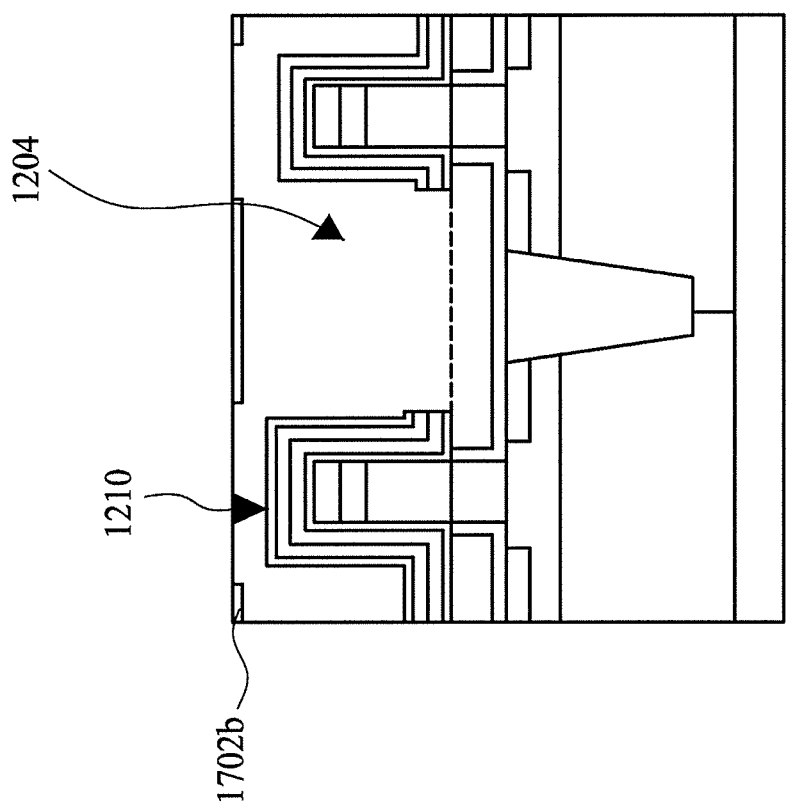

FIG. 18 is a sectional view illustrating the exemplary semiconductor device in accordance with some embodiments. As shown in FIGS. 17 and 18, a chemical polishing process is performed on the first interlayer dielectric 1204, the second layer 1702, and the second interlayer dielectric 1704, and stops on the lower portion 1702b of the second layer 1702.

Figure 19:
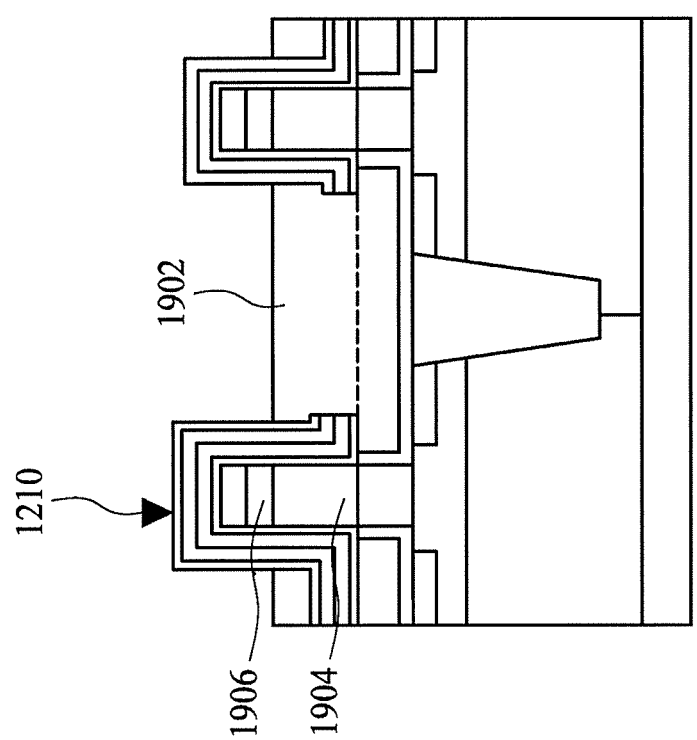

FIG. 19 is a sectional view illustrating the exemplary semiconductor device in accordance with some embodiments. Continuing from FIG. 18, as shown in FIG. 19, the first interlayer dielectric 1204 is etched back to form the isolation layer 1902 corresponding to a channel 1904 of the first vertical structure 1210 by using wet etching or plasma etching. In the embodiment, the isolation layer 1902 is aligned to a top surface of a channel 1904 in conjunction with a drain 1906. The method provides good thickness uniformity of the isolation layer 1902.

Figure 20:
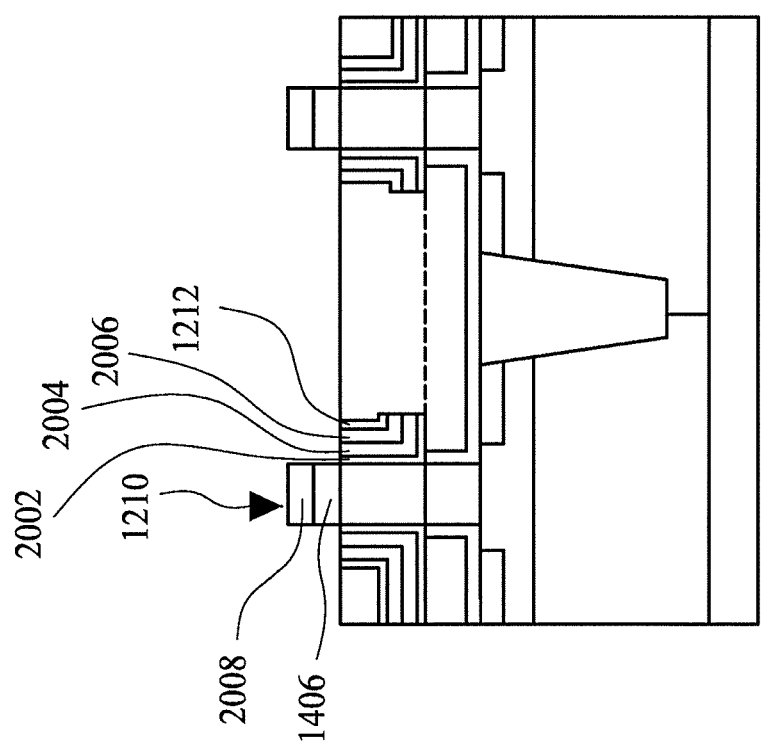

FIG. 20 is a sectional view illustrating the exemplary semiconductor device in accordance with some embodiments. Continuing from FIG. 14, as shown in FIG. 20, a portion of the high-k dielectric layer 2002, work function metal (WFM) layers 2004, 2006, and the first layer 1212 surrounding the drain 1406 of the vertical structure 1210 are etched to expose the drain 1406. The processes shown in FIG. 20 may be applied to and continues from FIG. 16 or FIG. 19. The drain 1406 may include a silicide 2008.

Figure 21:
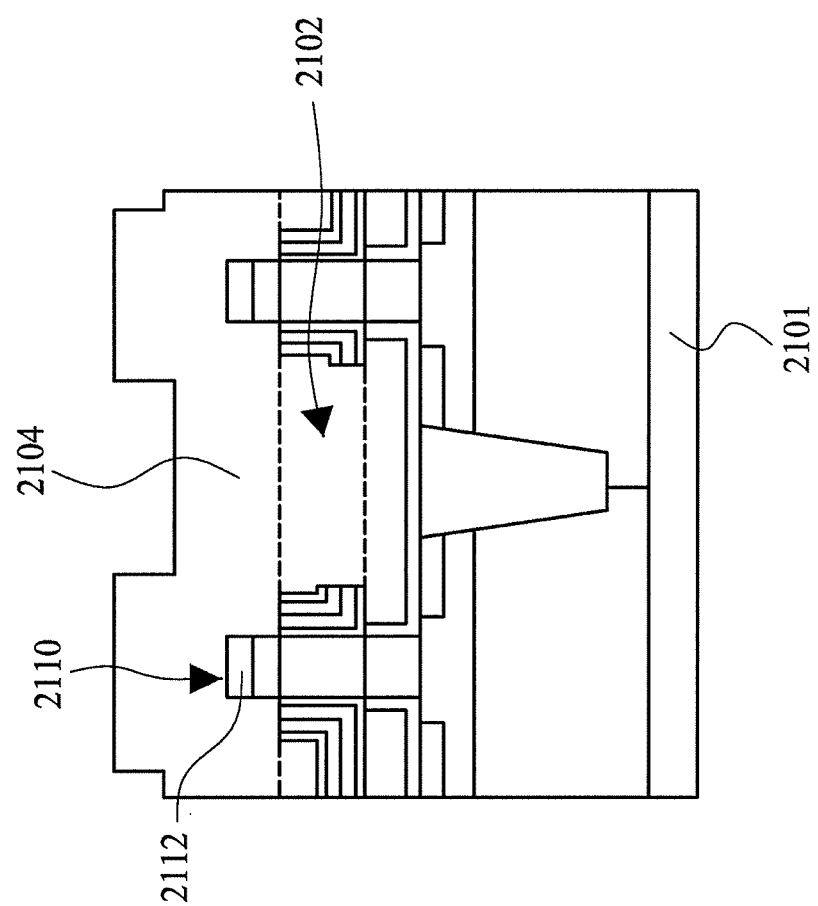
FIGS. 21-27 are sectional views illustrating another exemplary semiconductor device in accordance with some embodiments.

FIG. 21 is a sectional view illustrating an exemplary semiconductor device in accordance with some embodiments. As shown in FIG. 21, a substrate 2101 having a middle interlayer dielectric 2102 is provided. A vertical structure 2110 (similar to the vertical structure 1210 in FIG. 20) having a first layer 2112 is provided over the substrate 2101. The first layer 2112 may be, for example, a silicide. Moreover, a first interlayer dielectric 2104 (e.g., an oxide layer) is formed over the first layer 2112, the vertical structure 2110, and the middle interlayer dielectric 2102.

Figure 22:
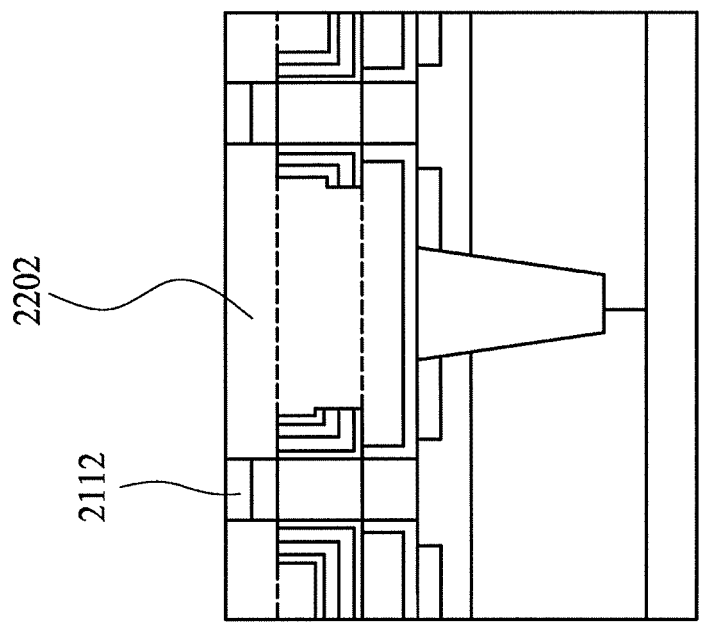

FIG. 22 is a sectional view illustrating the exemplary semiconductor device in accordance with some embodiments. As shown in FIG. 22, a chemical mechanical polishing is performed on the first interlayer dielectric 2104 and stops on the first layer 2112. The method provides good thickness uniformity of the isolation layer 2202 among different wafers.

Figure 23:
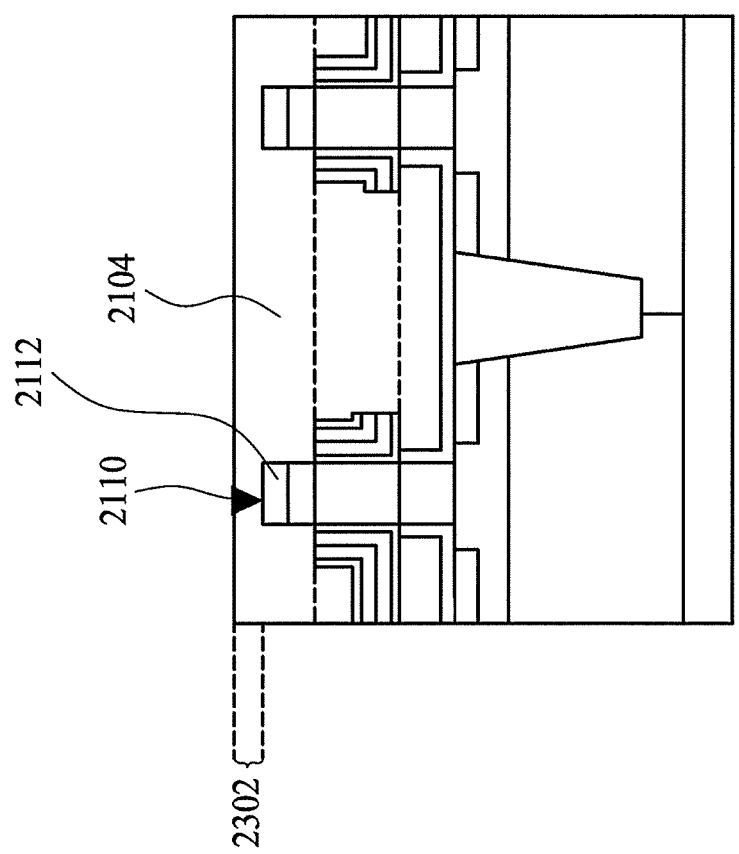

FIG. 23 is a sectional view illustrating the exemplary semiconductor device in accordance with some embodiments. Continuing from FIG. 21, as shown in FIG. 23, a chemical mechanical polishing is performed on the first interlayer dielectric 2104 and stops on a predetermined thickness 2302 (e.g., 100-1000 angstroms) of the first interlayer dielectric 2104 above the first vertical structure 2110. In details, the predetermined thickness 2302 may be a thickness measured from the first layer 2112 of the first vertical structure 2110. Stopping the CMP on the predetermined thickness 2302 of the first interlayer dielectric 2104 provides good die uniformity.

The chemical polishing process may be configured as follows: polishing down force may be about 0.5-5 psi; table speed may be about 30-110 rpm; slurry type may include colloidal $SiO_2$, $Al_2O_3$ or $CeO_2$ based slurries; and slurry flow rate may be about 50-500 ml/min.

Figure 24:
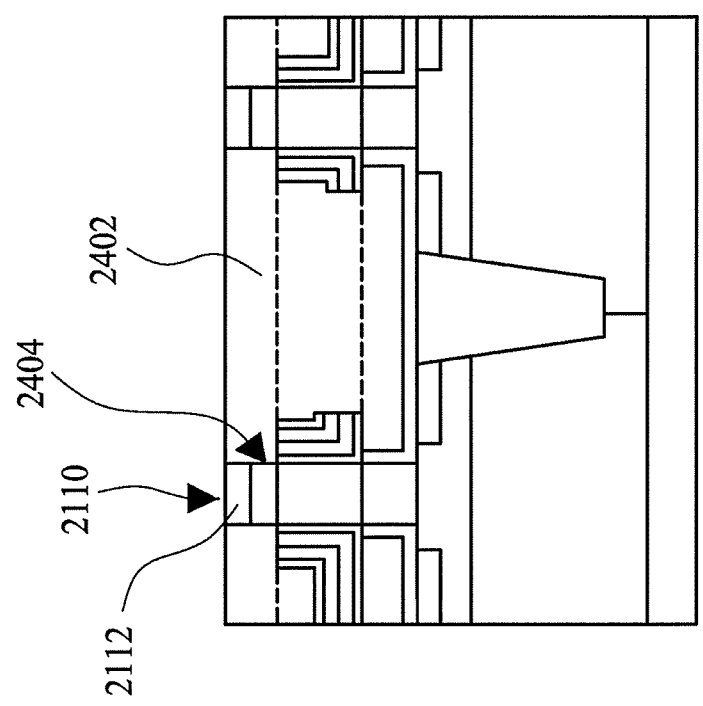

FIG. 24 is a sectional view illustrating the exemplary semiconductor device in accordance with some embodiments. Continuing from FIG. 23, as shown in FIG. 24, the first interlayer dielectric 2104 is etched back to form the isolation layer 2402 corresponding to a drain 2404 of the first vertical structure 2110 by using wet etching or plasma etching. The method provides good thickness uniformity of the isolation layer 2402 among different dies. The drain 2404 may include the first layer 2112 (made of silicide).

In some embodiments, before the etch back of the first interlayer dielectric 2104 by using wet etching or plasma etching, another etch back may be applied to the first interlayer dielectric 2104 by using gas cluster ion beams.

The gas cluster ion beams may be configured as follows: processing gas may include $NF_3$, $SiF_4$, $CHF_3$, or $CF_4$; carrier gas may include $N_2$ or He; the cluster accelerate voltages may be about 1 KV-200 KV; the cluster dose may be about $10^{13}$-$10^{17}$ $cm^2$/sec; the cluster flow may be about 100-5000 sccm; the pressure may be about $10^{-3}$-$10^{-8}$ torr; the cluster number may be about 100~50000 molecules; and the cluster size may be about 1-500 nanometers. Gas cluster ion beams may generate an active energy (e.g., 1-3 eV/molecule) for the surfaces of the first interlayer dielectric 2104, resulting in high temperature (e.g., $10^4$ K) at the surfaces. Gas cluster ion beams heats the processing gas to produce fluorine which reacts with the surfaces to form $SiF_4$ and $O_2$, O, NO, $NO_2$, $H_2O$, CO, or $CO_2$ volatile gases.

In some embodiments, a post wet clean is an option to reduce defects produced after the process of using gas cluster ion beams. The wet clean process may use combination of $O_3$ and dilute HF and Ammonia($NH_3$) as cleaner for one to five times.

Figure 25:
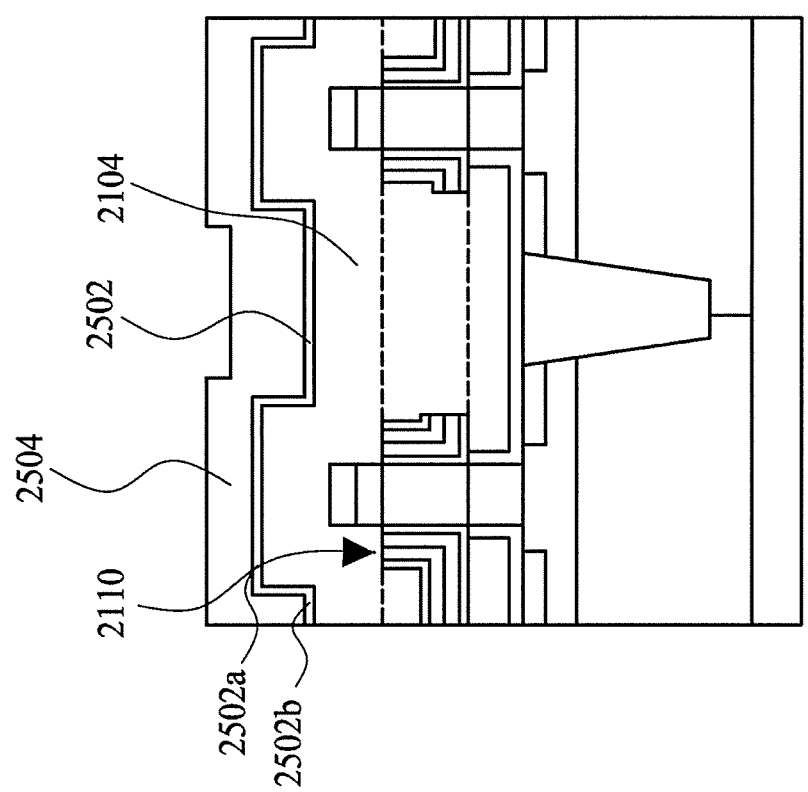

FIG. 25 is a sectional view illustrating the exemplary semiconductor device in accordance with some embodiments. Continuing from FIG. 21, as shown in FIG. 25, a second layer 2502 is formed over the first interlayer dielectric 2104. A second interlayer dielectric 2504 is formed over the second layer 2502.

The three layer sandwich structure of ONO (oxide/nitride/oxide layers) may be utilized to form the first interlayer dielectric 2104, the second layer 2502, and the second interlayer dielectric 2504. The first interlayer dielectric 2104 may be formed of, for example, flowable oxide; the second layer 2502 may be formed of, for example, SiN, SiON, SiC, SiCN, SiCO, or SiCON; and the second interlayer dielectric 2504 may be formed of, for example, plasma enhanced oxide (PE oxide). The second layer 2502 may have a thickness of about 5-300 angstroms. The second interlayer dielectric 2504 may have a thickness of about 100-3000 angstroms.

Moreover, a portion 2502a of the second layer 2502 refers to an upper portion which corresponds to protrusion of the first vertical structures 2110; the portion 2502b of the second layer 2502 refers to a lower portion which corresponds to underlying areas except for the vertical protrusion. Generally, the areas having the protrusion are less than 10% of the entire die so that the portion 2502a of the second layer 2502 is more vulnerable to chemical polishing process than is the portion 2502b of the second layer 2502.

Figure 26:
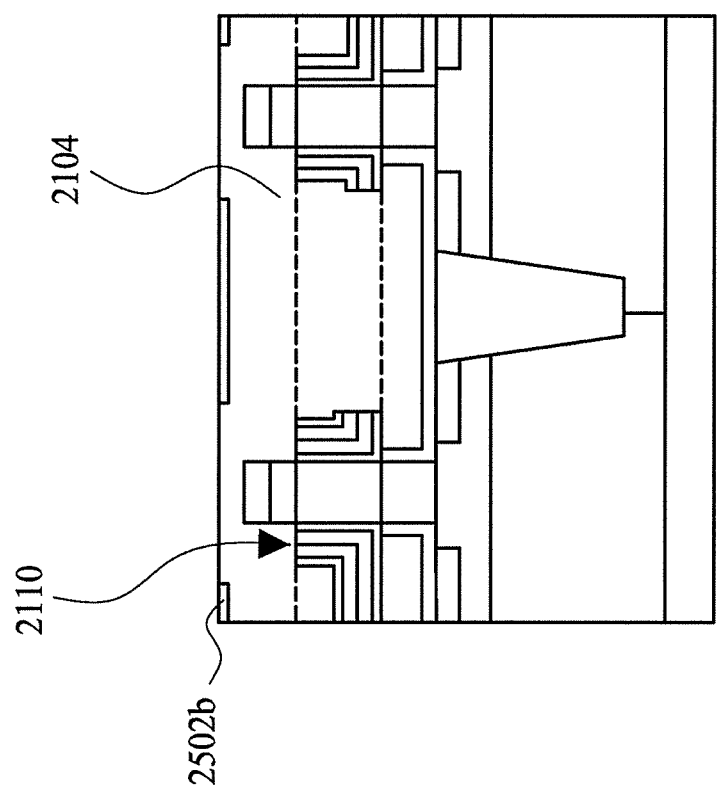

FIG. 26 is a sectional view illustrating the exemplary semiconductor device in accordance with some embodiments. As shown in FIGS. 25 and 26, a chemical polishing process is performed on the first interlayer dielectric 2104, the second layer 2502, and the second interlayer dielectric 2504, and stops on the lower portion 2502b of the second layer 2502.

Figure 27:
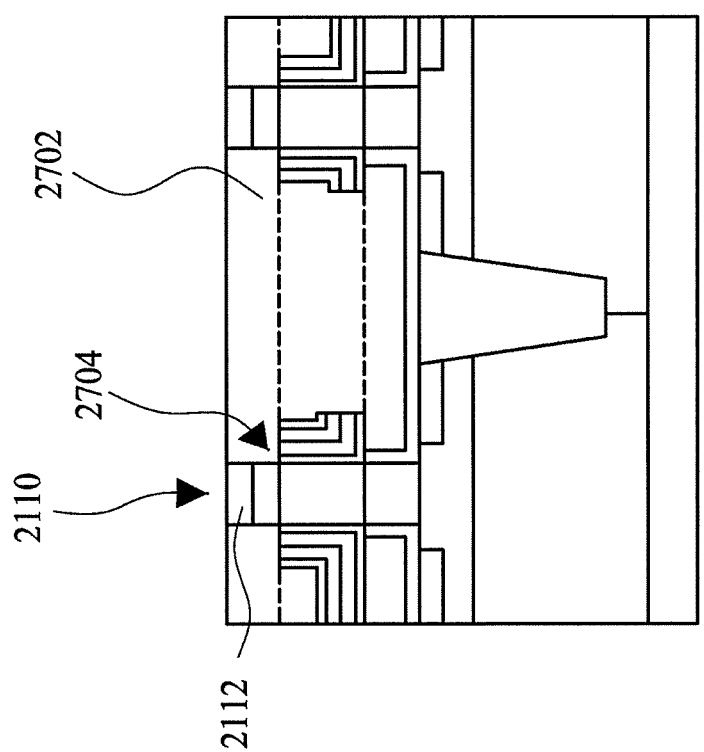

FIG. 27 is a sectional view illustrating the exemplary semiconductor device in accordance with some embodiments. Continuing from FIG. 26, as shown in FIG. 27, the first interlayer dielectric 2104 is etched back to form the isolation layer 2702 corresponding to a drain 2704 of the first vertical structure 2110 by using wet etching or plasma etching. The method provides good thickness uniformity of the isolation layer 2702. The drain 2704 may include the first layer 2112 (made of silicide).

Figure 28:
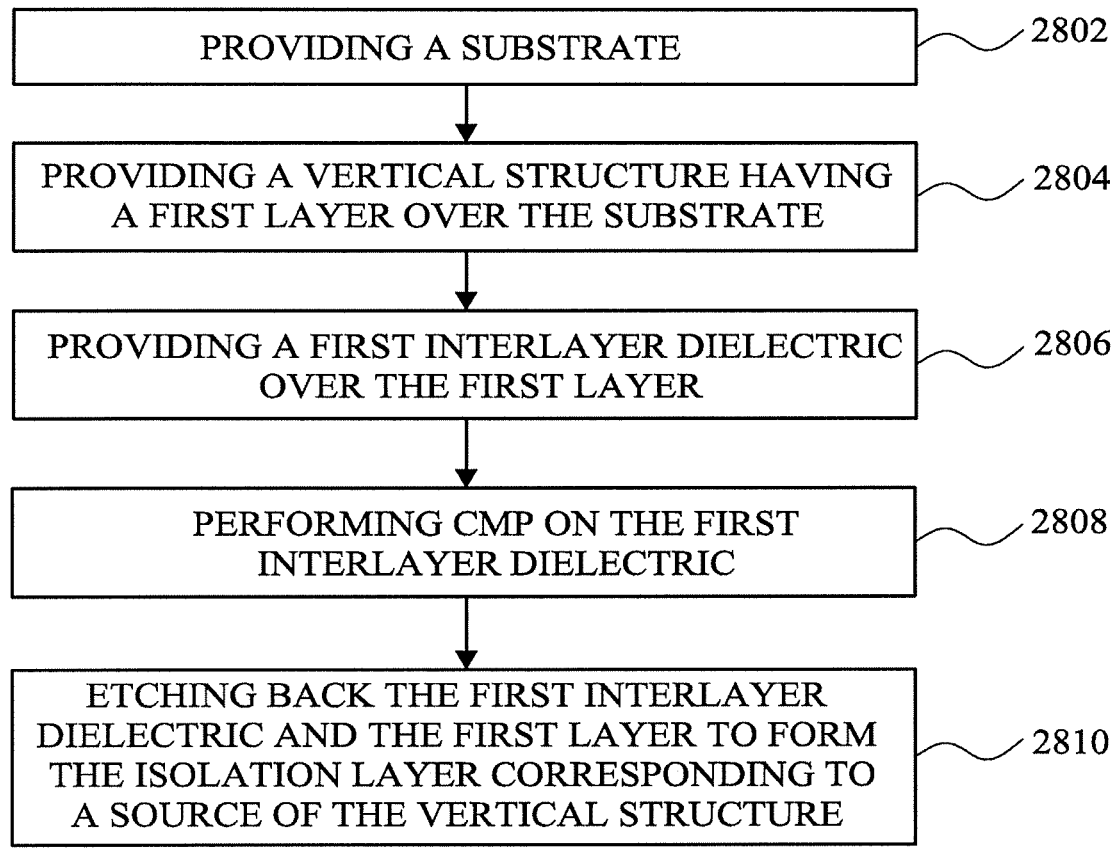
FIG. 28 is a flow chart for a method forming a vertical structure in accordance with some embodiments.

FIG. 28 is a flow chart for a method of forming a vertical structure. As shown in FIG. 28, a method 2800 is provided. The method 2800 includes the following operations: providing a substrate (2802); providing a vertical structure having a first layer over the substrate (2804); providing a first interlayer dielectric over the first layer (2806); performing CMP on the first interlayer dielectric (2808); and etching back the first interlayer dielectric and the first layer to form the isolation layer corresponding to a source of the vertical structure (2810).

The operation 2804 may further include providing the vertical structure having the first layer made of SiN as an etch stop layer over the substrate. The method 2800 may further include stopping the CMP on the first layer. The method 2800 may further include stopping the CMP on a predetermined thickness of the first interlayer dielectric above the vertical structure. The operation 2804 may further include etching back the first interlayer dielectric and the first layer by using wet etching or plasma etching. The method 2800 may further include etching back the first interlayer dielectric and the first layer by using gas cluster ion beams. The method 2800 may further include: providing a second layer over the first interlayer dielectric; providing a second interlayer dielectric over the second layer; performing CMP on the first interlayer dielectric, the second layer, and the second interlayer dielectric; and stopping the CMP on a lower portion of the second layer.

Figure 29:
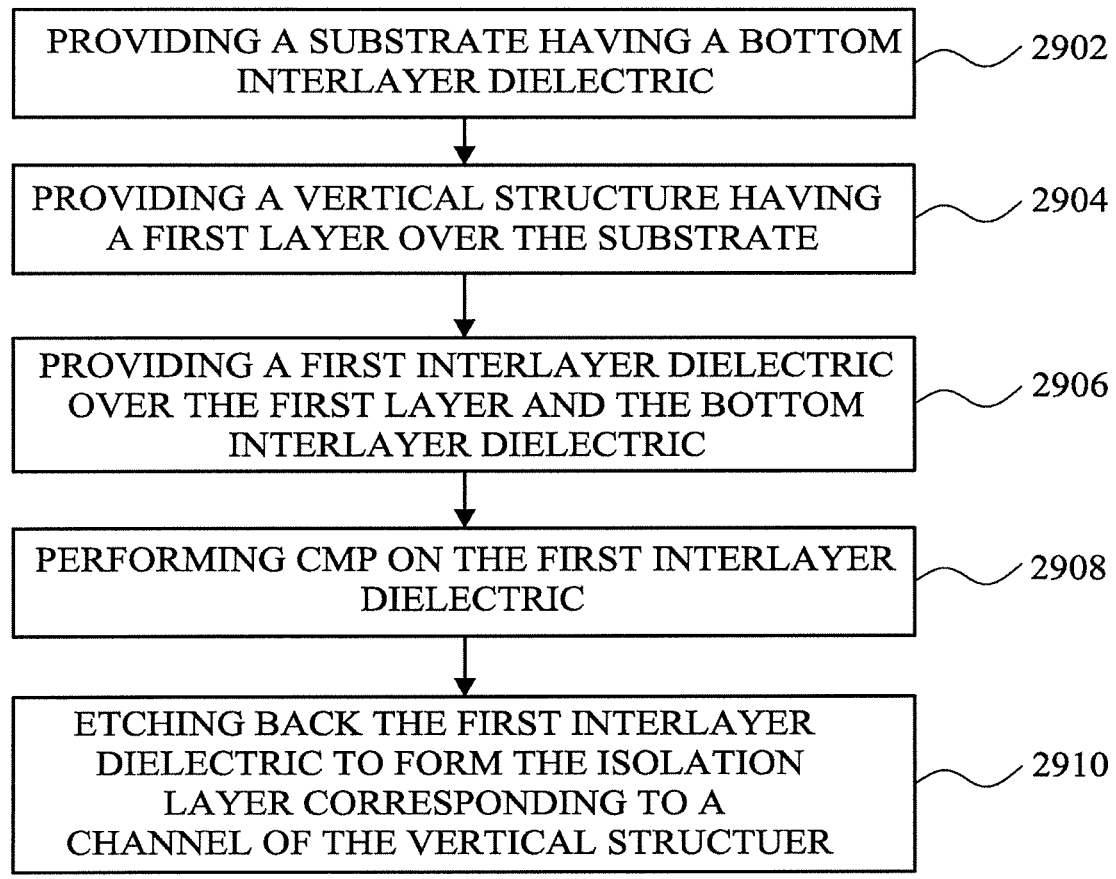
FIG. 29 is a flow chart for a method forming a vertical structure in accordance with some embodiments.

FIG. 29 is a flow chart for a method of forming a vertical structure. As shown in FIG. 29, a method 2900 is provided. The method 2900 includes the following operations: providing a substrate having a bottom interlayer dielectric (2902); providing a vertical structure having a first layer over the substrate (2904); providing a first interlayer dielectric over the first layer and the bottom interlayer dielectric (2906); performing CMP on the first interlayer dielectric (2908); and etching back the first interlayer dielectric to form the isolation layer corresponding to a channel of the vertical structure (2910).

The operation 2904 may further include providing the vertical structure having the first layer made of metal gate as an etch stop layer over the substrate. The method 2900 may further include stopping the CMP on the first layer. The method 2900 may further include stopping the CMP on a predetermined thickness of the first interlayer dielectric above the vertical structure. The operation 2910 may further include etching back the first interlayer dielectric by using wet etching or plasma etching. The method 2900 may further include etching back the first interlayer dielectric and the first layer by using gas cluster ion beams. The method 2900 may further include: providing a second layer over the first interlayer dielectric; providing a second interlayer dielectric over the second layer; performing CMP on the first interlayer dielectric, the second layer, and the second interlayer dielectric; and stopping the CMP on a lower portion of the second layer.

Figure 30:
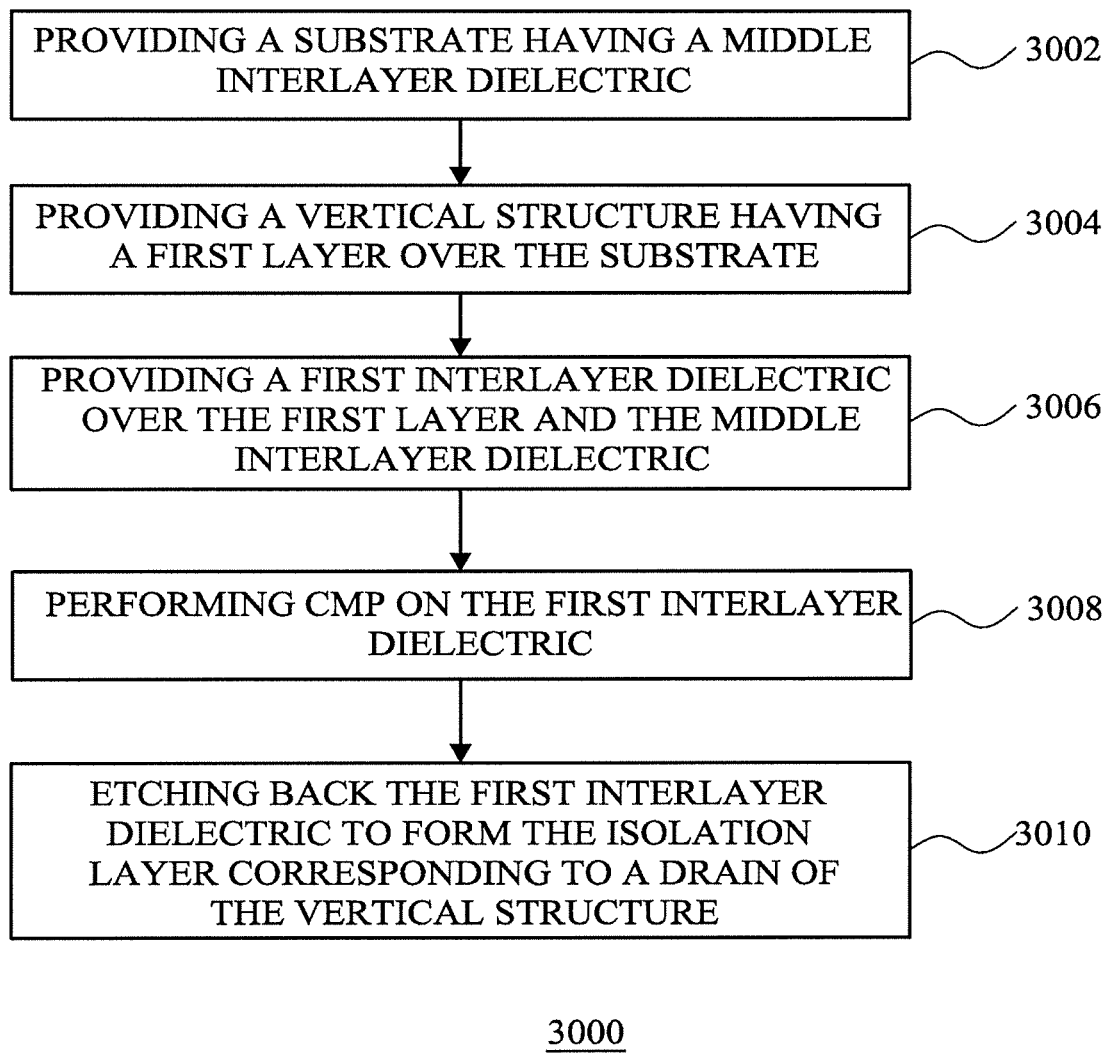
FIG. 30 is a flow chart for a method forming a vertical structure in accordance with some embodiments.

FIG. 30 is a flow chart for a method of forming a vertical structure. As shown in FIG. 30, a method 3000 is provided. The method 3000 includes the following operations: providing a substrate having a middle interlayer dielectric (3002); providing a vertical structure having a first layer over the substrate (3004); providing a first interlayer dielectric over the first layer and the middle interlayer dielectric (3006); performing CMP on the first interlayer dielectric (3008); and etching back the first interlayer dielectric to form the isolation layer corresponding to a drain of the vertical structure (3010).

The operation 3004 may further include providing the vertical structure having the first layer made of silicide as an etch stop layer over the substrate. The method 3000 may further include stopping the CMP on the first layer. The method 3000 may further include stopping the CMP on a predetermined thickness of the first interlayer dielectric above the vertical structure. The method 3000 may further include etching back the first interlayer dielectric by using gas cluster ion beams. The method 3000 may further include: providing a second layer over the first interlayer dielectric; providing a second interlayer dielectric over the second layer; performing CMP on the first interlayer dielectric, the second layer, and the second interlayer dielectric; and stopping the CMP on a lower portion of the second layer.

According to an exemplary embodiment, a method of forming an isolation layer is provided. The method includes the following operations: providing a substrate; providing a vertical structure having a first layer over the substrate; providing a first interlayer dielectric over the first layer; performing CMP on the first interlayer dielectric; and etching back the first interlayer dielectric and the first layer to form the isolation layer corresponding to a source of the vertical structure.

According to an exemplary embodiment, a method of forming an isolation layer is provided. The method includes the following operations: providing a substrate having a bottom interlayer dielectric; providing a vertical structure having a first layer over the substrate; providing a first interlayer dielectric over the first layer and the bottom interlayer dielectric; performing CMP on the first interlayer dielectric; and etching back the first interlayer dielectric to form the isolation layer corresponding to a channel of the vertical structure.

According to an exemplary embodiment, a method of forming an isolation layer is provided. The method includes the following operations: providing a substrate having a middle interlayer dielectric; providing a vertical structure having a first layer over the substrate; providing a first interlayer dielectric over the first layer and the middle interlayer dielectric; performing CMP on the first interlayer dielectric; and etching back the first interlayer dielectric to form the isolation layer corresponding to a drain of the vertical structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an isolation structure, comprising:
   providing a shallow trench isolation in a substrate;
   providing a vertical structure that includes a source region, a channel region over the source region and a drain region over the channel region, the channel region and the drain region protruding from an isolation layer, the isolation layer including an etch stop layer formed on the source region and the shallow trench isolation and a first ILD layer;

forming a gate dielectric layer over the channel region and the drain region and on the etch stop layer and the first ILD layer;
forming one or more conductive layers over the gate dielectric layer;
providing a second ILD layer over the one or more conductive layers;
performing CMP on the second ILD layer, and stopping the CMP upon reaching an uppermost layer of the one or more conductive layers; and
etching back the second ILD layer to a level corresponding to the channel region.

2. The method of claim 1, wherein the etching back uses wet etching or plasma etching.

3. The method of claim 1, wherein the etching back uses gas cluster ion beams.

4. The method of claim 1, wherein the isolation layer is formed by:
forming a layer for the etch stop layer over the vertical structure, the layer including:
a horizontal upper portion overlying a top of the vertical structure,
a horizontal bottom portion overlying the shallow trench isolation, and
a vertical side portion extending downward from the upper portion and in overlying contact with a side of the source, channel and drain regions;
providing a dielectric layer for the first ILD layer over the etch stop layer's upper, bottom and side portions;
performing CMP on the dielectric layer, and stopping the CMP upon reaching a top of the etch stop layer's upper portion; and
etching back the dielectric layer and the etch stop layer's side portion, thereby exposing the side of the channel and the drain and forming the isolation layer.

5. The method of claim 4, wherein during the etching back the dielectric layer, the dielectric layer and the etch stop layer's side portion are etched together.

6. The method of claim 4, wherein the etch stop layer is made of SiN.

7. The method of claim 4, wherein the vertical structure includes a silicide layer over the drain region formed before the etch stop layer is formed.

8. The method of claim 7, wherein:
the silicide layer has a top surface and a side, and
the etch stop layer is provided such that the vertical side portion is in overlying contact with the side of the silicide layer.

9. The method of claim 4, wherein the etching back of the dielectric layer leaves a top surface of the dielectric layer aligned with a top surface of the source region.

10. The method of claim 7, wherein the etching back the dielectric layer and the etch stop layer removes (i) the etch stop layer's horizontal upper portion and (ii) sections of the etch stop layer's vertical side portions that overlie the channel region, the drain region and the silicide layer, and does not remove sections of the etch stop layer's vertical portions that overlie the source.

11. The method of claim 1, wherein the gate dielectric layer includes a high-k dielectric layer.

12. The method of claim 1, wherein the uppermost layer of the one or more conductive layer is a metal gate layer.

13. The method of claim 1, wherein:
each of the gate dielectric layer and the one or more conductive layer includes a lower horizontal portion that projects horizontally away from a bottom end of the respective vertical portion, and
the method further comprises etching away a distal section of each of the lower horizontal portions, thereby shortening each of the lower horizontal portions.

14. A method of forming an isolation structure, comprising:
providing a vertical structure that includes a source region, a channel region over the source region and a drain region over the channel region, the channel region and the drain region protruding from an isolation layer;
forming a gate dielectric layer over the channel region and the drain region;
forming one or more conductive layers over the gate dielectric layer;
forming a first ILD layer over the one or more conductive layers, the first ILD layer including a top layer, a middle layer and a bottom layer;
performing first CMP on the first ILD layer, and stopping the first CMP so that part of the middle layer remains;
performing second CMP to remove the part of the middle layer and the bottom layer, and stopping the second CMP upon reaching an uppermost layer of the one or more conductive layers; and
etching back the bottom layer to a level corresponding to the channel region,
wherein the top layer is fully removed in the first CMP and the middle layer is fully removed in the second CMP.

15. The method of claim 14, wherein:
after the CMP is performed, a part of the middle layer remains, and the etching back is performed on the first ILD layer in which the part of the middle layer remains.

16. The method of claim 14, wherein, before the first ILD layer is formed, part of the gate dielectric layer and the one or more conductive layers is removed by a patterning operation.

17. The method of claim 14, wherein the middle layer includes at least one selected from the group consisting of SiN, SiON, SiC, SiCN, SiCO and SiCON.

18. The method of claim 14, wherein a thickness of the middle layer is in a range from 0.5 nm to 30 nm and a thickness of the top layer is in a range from 10 nm to 300 nm.

19. The method of claim 14, wherein the isolation layer is formed by:
forming an etch stop layer over the vertical structure, the etch stop layer including:
a horizontal upper portion overlying a top of the vertical structure,
a horizontal bottom portion overlying a shallow trench isolation, and
a vertical side portion extending downward from the upper portion and in overlying contact with a side of the source, channel and drain regions;
providing a second ILD layer over the etch stop layer's upper and side portions;
performing third CMP on the second ILD layer, and stopping the third CMP upon reaching a top of the etch stop layer's upper portion; and
etching back the second ILD layer and the etch stop layer's side portion, thereby exposing the side of the channel and the drain and forming the isolation layer.

20. A method of forming an isolation structure, comprising:
providing a shallow trench isolation in a substrate;
providing a vertical structure that includes a source region, a channel region over the source region and a drain region over the channel region, the channel region and the drain region protruding from an isolation layer, the isolation layer including an etch stop layer formed on the source region and the shallow trench isolation and a first ILD layer;

forming a gate dielectric layer over the channel region and the drain region;

forming one or more conductive layers over the gate dielectric layer;

providing a second ILD layer over the one or more conductive layers;

performing CMP on the second ILD layer, and stopping the CMP before reaching an uppermost layer of the one or more conductive layers disposed on an top of the vertical structure, thereby leaving a remaining layer of the second ILD layer to cover a highest portion of a structure disposed over a substrate; and etching back the second ILD layer with the remaining layer to a level corresponding to the channel region, wherein a thickness of the remaining layer of the second ILD layer from the highest portion is in a range from 10 nm to 100 nm.

* * * * *